US009928921B2

(12) United States Patent
Otsuka

(10) Patent No.: US 9,928,921 B2
(45) Date of Patent: *Mar. 27, 2018

(54) NON-VOLATILE MEMORY, SEMICONDUCTOR DEVICE AND READING METHOD

(71) Applicant: LAPIS Semiconductor Co., Ltd., Yokohama (JP)

(72) Inventor: Masayuki Otsuka, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/042,730

(22) Filed: Feb. 12, 2016

(65) Prior Publication Data
US 2016/0163399 A1 Jun. 9, 2016

Related U.S. Application Data

(63) Continuation of application No. 13/860,221, filed on Apr. 10, 2013, now Pat. No. 9,293,219.

(30) Foreign Application Priority Data

Apr. 13, 2012 (JP) .................. 2012-092458

(51) Int. Cl.
*G11C 17/16* (2006.01)
*G11C 17/18* (2006.01)
(52) U.S. Cl.
CPC .............. *G11C 17/18* (2013.01); *G11C 17/16* (2013.01)
(58) Field of Classification Search
CPC .................................................... G11C 17/18
See application file for complete search history.

(56) References Cited

U.S. PATENT DOCUMENTS 5,446,407 A 8/1995 Yamamoto
5,572,472 A 11/1996 Kearney et al.
(Continued)

FOREIGN PATENT DOCUMENTS

EP 0 817 013 A2 1/1998
JP 08-153394 A 6/1996
(Continued)

OTHER PUBLICATIONS

Teichmann, J. et al., ("One Time Programming (OTP) with Zener Diodes in CMOS Processes," 33rd Conf. on European Solid-State Device Research (ESSDERC), IEEE, 2003).*
(Continued)

*Primary Examiner* — Anthan Tran
*Assistant Examiner* — Mushfique Siddique
(74) *Attorney, Agent, or Firm* — Studebaker & Brackett PC

(57) ABSTRACT

There is provided a non-volatile memory circuit including: plural storage element sections each including a zener zap device and a switch section that connects an anode of the zener zap device to an output terminal during data reading; and wherein cathodes of respective zener zap devices of the plural storage element sections are commonly connected so as to be connected to a power supply employed in the writing or to a power supply employed in the reading, wherein the output terminals of the plural storage element sections are commonly connected to an input terminal of a detector, an anode of each of the storage element sections being connected to a ground voltage during data writing, and wherein the switch section is switched ON during data reading so as to connect the anode of the storage element section through the output terminal to the input terminal of the detector.

12 Claims, 8 Drawing Sheets

(56) References Cited

U.S. PATENT DOCUMENTS

| | | | |
|---|---|---|---|
| 5,646,879 A | 7/1997 | Harshfield | |
| 5,818,749 A | 10/1998 | Harshfield | |
| 6,055,173 A * | 4/2000 | Mullarkey | G11C 17/18 365/225.7 |
| 6,788,607 B2 * | 9/2004 | Duval | G11C 17/18 365/189.07 |
| 7,489,535 B2 | 2/2009 | Mallikararjunaswamy | |
| 7,613,062 B2 * | 11/2009 | Nakano | G11C 17/16 365/189.19 |
| 8,331,126 B2 * | 12/2012 | Terzioglu | G11C 17/18 365/158 |
| 9,293,219 B2 * | 3/2016 | Otsuka | G11C 17/18 |
| 2001/0019280 A1 | 9/2001 | Pulvirenti | |
| 2006/0092742 A1 * | 5/2006 | Paillet | G11C 17/146 365/225.7 |
| 2007/0165058 A1 | 7/2007 | Tamura et al. | |
| 2008/0002504 A1 | 1/2008 | Nakano et al. | |
| 2010/0061131 A1 * | 3/2010 | Bosmuller | G11C 17/18 365/51 |
| 2013/0272051 A1 * | 10/2013 | Otsuka | G11C 17/16 365/96 |

FOREIGN PATENT DOCUMENTS

| | | | | |
|---|---|---|---|---|
| JP | 2003-204069 A | 7/2003 | | |
| JP | 2005-182899 A | 7/2005 | | |
| JP | 2007-265540 A | 10/2007 | | |
| JP | 2008-016085 A | 1/2008 | | |
| JP | 2008016085 A | * | 1/2008 | G11C 17/16 |
| WO | WO 2010147029 A1 | * | 12/2010 | G11C 13/003 |
| WO | 2012/003165 A1 | 1/2012 | | |
| WO | WO 2012003165 A1 | * | 1/2012 | G11C 17/16 |

OTHER PUBLICATIONS

J. Teichmann et al., "One Time Programming (OTP) with Zener Diodes in CMOS Processes", 2003, pp. 433-436, European Solid-State Device Research, IEEE, Germany.

Erickson et al., Fundamentals of Power Electronics, Second Edition, 2001, pp. 61-105, Springer Science + Business Media, LLC, USA.

Sedra et al., Microelectronic Circuits, Sixth Edition, 2009, Oxford University Press, USA.

"Connect", Merriam-Webster.com, 2014, http://www.merriam-webster.com (Nov. 4 2014).

An Office Action "Notice of Reasons for Rejection" issued by the Japanese Patent Office dated Jun. 7, 2016, which corresponds to Japanese Patent Application No. 2012-092458 and is related to U.S. Appl. No. 15/042,730; with English language translation.

\* cited by examiner

NON-VOLATILE MEMORY, SEMICONDUCTOR DEVICE AND READING METHOD

CROSS-REFERENCE TO RELATED APPLICATION

This application is a continuation of U.S. patent application Ser. No. 13/860,221 filed on Apr. 10, 2013, which claims priority under 35 USC 119 from Japanese Patent Application No. 2012-092458 filed on Apr. 13, 2012, the disclosure of which is incorporated by reference herein.

BACKGROUND

Technical Field

The present invention relates to a non-volatile memory circuit (also referred to below as PROM) that employs zener zap devices (also referred to below as ZapFuses) and to a semiconductor device and reading method thereof. The present invention particularly relates to a non-volatile memory suitable for achieving increased capacities without causing a drop in reading speed, and to a semiconductor device of the same.

Related Art

As disclosed in for example Japanese Patent Application Laid-Open (JP-A) No. 2003-204069, in a zener zap device with a zap diode configured by forming a P-type well region to a surface layer of an N-type semiconductor layer, forming a P-type anode region and an N-type cathode region in the P-type well region, and with the P-type anode region and the N-type cathode region respectively connected through an anode electrode and a cathode electrode, the PN junction is broken down by applying a reverse bias voltage of a breakdown voltage or greater to the zap diode so as to short between the anode electrode and the cathode electrode and act as a resistor.

A PROM circuit employing zener zap devices as storage units for single bits operates in a data write mode that zaps the zener zap devices for each bit, and in a read mode that reads the written data. In the read mode, a method and a circuit configuration is employed in which a current is applied to each of the zener zap devices for every bit, and the data of each bit is read to be transmitted to an operation circuit.

For example JP-A No. 2005-182899, discloses a PROM circuit including: plural memory devices (zener zap devices) each having one end connected to a common write current input terminal and the other end connected to respective read terminals; plural ON/OFF state controllable switch elements (transistors) each having one end connected to the respective read terminal and the other end connected to a common reference voltage terminal; plural current sources respectively connected between the plural read terminals and the reference voltage terminal; and a diode having one end connected to the write current input terminal and the other end connected to a voltage source, with the diode connected in a direction so as to prevent a write current during writing from flowing to the voltage source. The PROM circuit is configured such that when selectively writing to the memory devices, the switch elements are selectively placed in an ON state, and changes in the resistance values of the memory devices are selectively induced by a current flowing from the write current input terminal and into a write current absorption terminal. When data written to the memory devices is read, all of the plural switch elements are placed in an OFF state, and a rise or fall in voltage with respect to the reference voltage terminal is induced in the plural read terminals (P2 to P3) due to differences in voltage fall occurring in the respective memory devices due to current flowing from the voltage source, through the diode and the plural memory devices, to the plural current sources.

According to the PROM circuit of JP-A No. 2005-182899, the previous need to provide an interference prevention diode to each of the PROM devices is eliminated, and a single switch suffices for devices over a large area. The surface area occupied in an IC can accordingly be reduced. Moreover, even should a large voltage occur at both ends of a PROM device during writing, the voltage applied to the switch elements for selective writing is low, and so there is no need to employ an element with a high withstand voltage. Moreover, the terminal potential of the selective writing switch elements increases due to the voltages arising at both ends of the PROM circuit, enabling difficulties in switch element control and inability to make sufficient write current flow to be resolved.

However, in the PROM circuit of JP-A No. 2005-182899, there is a need to form a thick A1 filament line in the zener zap devices to apply a constant zap current in the region of 150 mA to 200 mA such that the A1 filament line does not break when a read current flows during normal circuit operation.

As a result, there is the issue of an increase in cell size due to provision of the transistor for applying the zap current of 150 mA to 200 mA and the inflow prevention diode. In particular, the chip surface area of the product increases the higher the number of bits and the larger the surface area occupancy ratio of the PROM circuit.

JP-A No. 2007-265540 discloses a PROM circuit directed towards resolving such issues. The PROM circuit of JP-A No. 2007-265540 is configured including, for each single zener zap device: a diode that prevents inflow to another bit in a normal mode; a diode to protect a circuit on an output terminal side; a first transistor that selects the zener zap device and applies a zap current during writing; a second transistor that serves as a switch element controlling a read current; a resistor that causes a voltage fall during reading; and a latch circuit that holds data read through the zener zap device during read mode.

Such a configuration enables prolonged use even with a fine A1 filament zapped with a low current critical for zapping, enabling a reduction in cell size to be achieved. It is accordingly possible to provide a zener zap PROM circuit with reduced chip size.

For PROM circuits employing zener zap devices as storage units for single bits, various known technology is proposed, such as for example disclosed in JP-A No. 2003-204069, that enables economical electrical writing on a small-scale and features high reliability after writing, and also avoids an increase in surface area accompanying increasing capacities of PROM circuits.

However, in the technology of for example JP-A No. 2007-265540, the latch circuits and inflow prevention diodes etc. are provided for each storage unit, leading to an increase in layout surface area when the number of storage units is increased in order to achieve increased capacity.

Moreover, in each of the related technologies, a write power supply and a read power supply are each separately provided, and moreover the read power supply is configured for each of the storage units, leading to an increase in layout surface area when the number of storage units is increased in order to achieve increased capacity.

Moreover, in each of the related technologies, in PROM circuits configured to serially read the output of the storage units, namely PROM circuits configured to increase capacity with the cathodes of the zener zap devices (ZapFuse) commonly connected and only the zener zap devices and transistors for selecting the anode of the zener zap devices connected in parallel, no consideration is given to the voltage swing of the cathodes of the zener zap devices detected during data reading. In such PROM circuits configured to serially read the output of the storage units, when the number of storage units is increased to achieve increased capacity, an increase in read time occurs accompanying the increase in capacity of cathodes, with the issue of decreased read speed.

Accordingly, in the related technology, and in particular in PROM circuits configured to serially read the output of the storage units, an increase in surface area and an increase in read time is unavoidable when the number of storage units is increased to achieved increased capacity.

SUMMARY

In order to address the above issues, an object of the present invention is to enable an increase in surface area and an increase in read time to be avoided accompanying increased capacity in a non-volatile memory circuit (PROM circuit) using zener zap devices (ZapFuses).

A first aspect of the present invention provides a non-volatile memory circuit including:

plural storage element sections each including a zener zap device and a switch section that connects an anode of the zener zap device to an output terminal during data reading; and wherein cathodes of respective zener zap devices of the plural storage element sections are commonly connected so as to be connected to a power supply employed in the writing or to a power supply employed in the reading, wherein the output terminals of the plural storage element sections are commonly connected to an input terminal of a detector, an anode of each of the storage element sections being connected to a ground voltage during data writing, and wherein the switch section is switched ON during data reading so as to connect the anode of the storage element section through the output terminal to the input terminal of the detector.

Moreover, in the non-volatile memory circuit of the present invention, the detector converts a current value that is output when the storage element section that is the target for reading out of the plural storage element sections changes during data reading to a voltage that lies within a predetermined amplitude.

A second aspect of the present invention provides a semiconductor device including:

the non-volatile memory circuit of the first aspect; and a central processing unit that employs the non-volatile memory circuit to perform writing or reading of data, or both writing and reading of data.

A third aspect of the present invention provides a method of reading a non-volatile memory reading, the method including:

supplying a read power supply to respective cathodes of plural zener zap devices;

selecting a first storage element section including one of the zener zap devices, and supplying data based on data stored in the zener zap device to a differential voltage amplification circuit and reading the stored data; and selecting a second storage element section including one of the zener zap devices different to that of the first storage element section, and, when supplying data based on data stored in the second zener zap device to the differential voltage amplification circuit, supplying an input voltage to the differential voltage amplification circuit through a detector that restricts the input voltage so as to lie within a predetermined amplitude, and reading the stored data.

According to the present invention, it is possible to avoid an increase in surface area and an increase in read time accompanying increased capacity in a non-volatile memory circuit (PROM circuit) employing zener zap devices (ZapFuses), enabling a small size and high speed to be achieved in a semiconductor device and an electronic device provided with the non-volatile memory circuit (PROM circuit) of the present invention.

BRIEF DESCRIPTION OF THE DRAWINGS

Exemplary embodiments of the present invention will be described in detail based on the following figures, wherein.

DETAILED DESCRIPTION

Explanation follows regarding exemplary embodiments of the present invention, with reference to the drawings.

Figure 1:
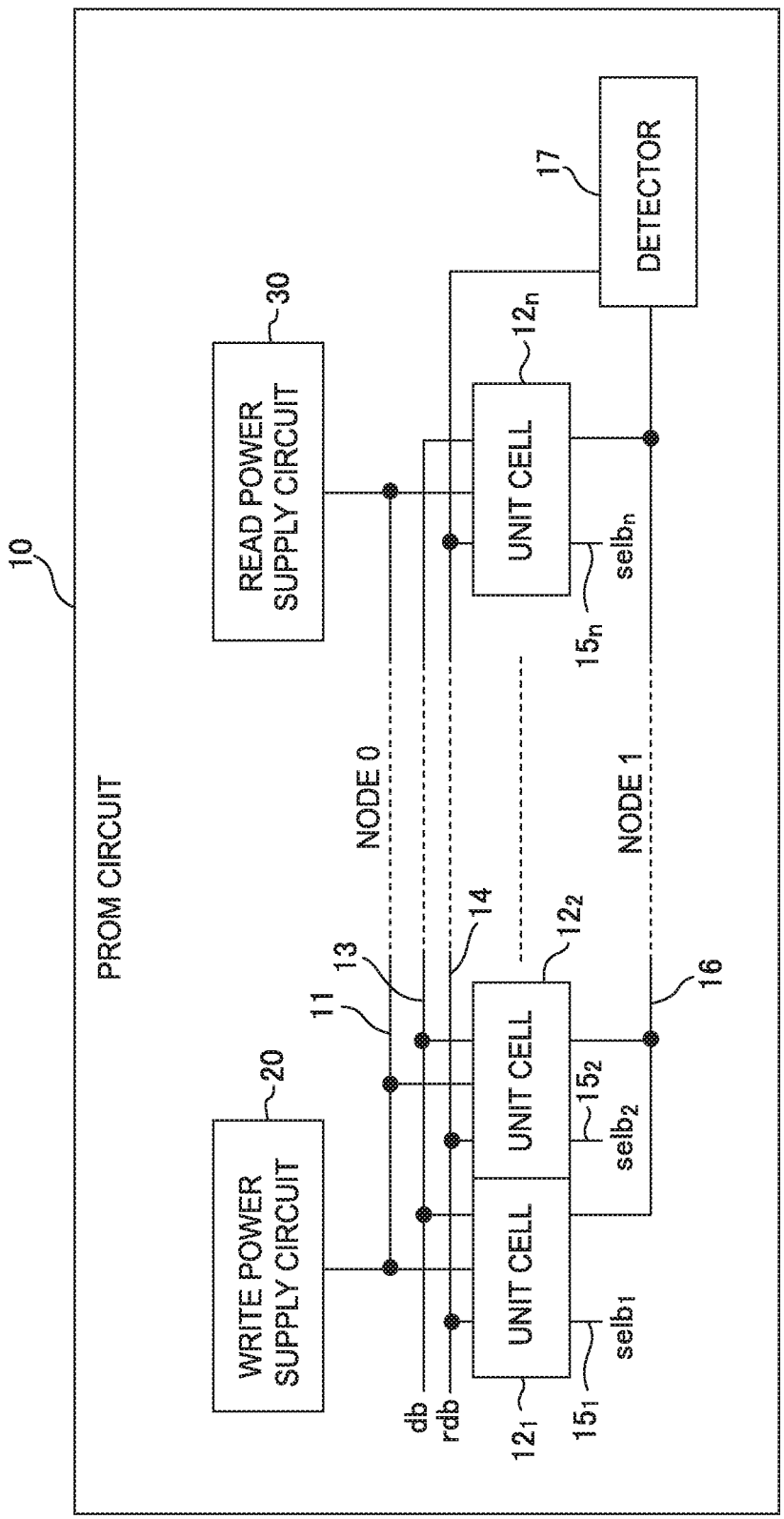
FIG. 1 is a block diagram illustrating a configuration example of a non-volatile memory circuit according to an exemplary embodiment.

FIG. 1 shows a configuration of a non-volatile memory circuit (annotated as "PROM" in FIG. 1) 10 according to the present exemplary embodiment. The non-volatile memory circuit 10 includes: a write power supply circuit 20; a read power supply circuit 30; a power supply line 11 (also referred to below as node 0) that selectively supplies a data write voltage from the write power supply circuit 20 or a data read voltage from the read power supply circuit 30; n (n being an integer of two or more) individual unit cells $12_1$ to $12_n$, as shown in detail in FIG. 2, that each stores one bit of data and that are respectively connected in parallel between the power supply line 11 and a reference power supply line connected to ground level, not shown in the drawings; signal lines 13, 14, and $15_1$ to $15_n$ that input each signal (db, rdb, $selb_1$ to $selb_n$) input from an externally provided control section to each of the unit cells $12_1$ to $12_n$; and a detector 17 that is input through an output line 16 (also referred to below as node 1) with an output current from the unit cells $12_1$ to $12_n$ during data reading.

Figure 2:
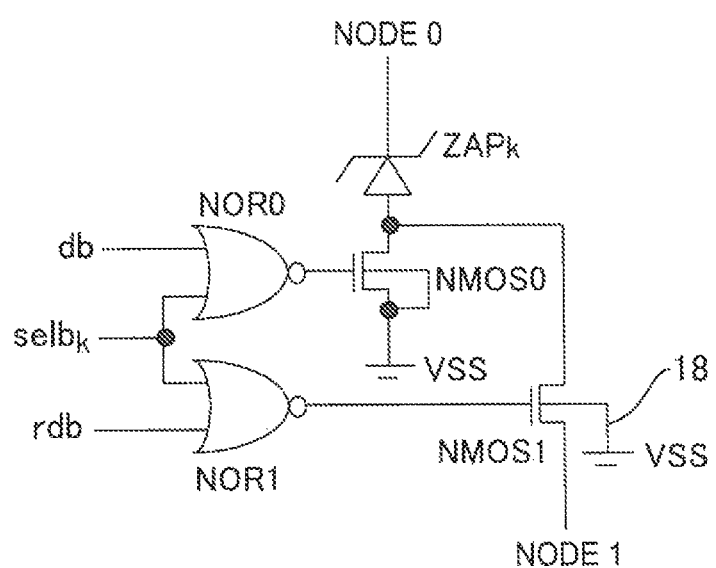
FIG. 2 is a circuit diagram illustrating a configuration example of a storage element circuit employing the non-volatile memory circuit illustrated in FIG. 1.

Since each of the unit cells $12_1$ to $12_n$, serving as each storage element section provided in the non-volatile memory circuit 10 of FIG. 1, is of a similar configuration to each other, explanation follows regarding a $k^{th}$ (k=1, 2, . . . , n) unit cell illustrated in FIG. 2.

This unit cell includes: a zener zap device ZAPk with a cathode connected to the node 0 (the power supply line 11); a transistor NMOS 0 configured from an NMOS transistor that is connected to the anode of the zener zap device ZAPk and connects the zener zap device ZAPk to a reference power source line of a ground level reference voltage VSS during data writing; and a transistor NMOS 1 configured from an NMOS transistor that is connected to the anode of the zener zap device ZAPk and connects the zener zap device ZAPk to the node 1 (output line 16) during data reading. Moreover, the present example includes a NOR circuit NOR 0 and a NOR circuit NOR 1 that control the transistor NMOS 0 and the transistor NMOS 1 according to data write operations or data read operations.

The unit cell serving as the single bit storage element section of the present example accordingly includes a single zener zap device (ZapFuse), two ZapFuse selection transistors, and two NOR gates.

In FIG. 2, a signal db is a write instruction signal, and a signal $selb_k$ is a selection instruction signal for selecting the $k^{th}$ unit cell, and signal rdb is a read instruction signal. These signals are respectively input from a control section, not shown in the drawings, to the respective terminals of the NOR circuit NOR 0 and the NOR circuit NOR 1 through the signal line 13, the signal line 15k, and the signal line 14 shown in FIG. 1.

The transistor NMOS 0 and the transistor NMOS 1 are N channel MOS transistors, and the reference voltage VSS is at ground level (ground).

In the zener zap device ZAPk, the cathode is connected to the power supply line 11 (node 0), and the anode is commonly connected to the respective drains of the transistor NMOS 0 and the transistor NMOS 1.

The gate of the transistor NMOS 0 is connected to the output terminal of the NOR circuit NOR 0, and the source of the transistor NMOS 0 is connected to the reference voltage VSS (ground level) through a reference power supply line 18. The gate of the transistor NMOS 1 is connected to the output terminal of the NOR circuit NOR 1, and the source of the transistor NMOS 1 is connected to the output line (node 1) 16.

One input terminal of the NOR circuit NOR 0 is input with the signal db, and the other input terminal is commonly connected together with one input terminal of the NOR circuit NOR 1 and is input with the signal $selb_k$. The other input terminal of the NOR circuit NOR 1 is input with the signal rdb.

Note that there is no limitation to such a configuration as long as the logic circuit including the NOR circuit NOR 0 and the NOR circuit NOR 1 operates so as to switch ON the corresponding transistor NMOS 0 during writing based on the unit selecting signal $selb_k$, and operates to switch ON the corresponding transistor NMOS 1 during reading.

Prior to writing, the zener zap device ZAPk acts as a diode and current accordingly does not flow from the cathode to the anode. However after writing the zener zap device ZAPk is shorted and so current flows from the cathode to the anode.

A read voltage (also referred to below as IVC) that is lower than the power supply voltage is applied to the cathode of the zener zap device ZAPk when reading data from the zener zap device ZAPk, and data is read by detecting the current flowing in the zener zap device ZAPk.

A write voltage (also referred to below as HV) that is higher than the power supply voltage is applied to the cathode of the zener zap device ZAPk when writing data to the zener zap device ZAPk, writing data by causing zener breakdown to occur.

The signal $selb_k$ is made ground level (also referred to below as L) when selecting the $k^{th}$ zener zap device ZAPk, and is made the power supply voltage level (also referred to below as H) during non-selection.

The signal db is made L when writing to the zener zap device ZAPk, and otherwise is made H.

The signal rdb is made L when reading from the zener zap device ZAPk, otherwise is made H.

The node 0 (the power supply line 11) is made IVC during reading, HV during writing, and otherwise is made ground level.

The node 1 (the output line 16) is made the detector input voltage level of about 0.3V during reading, and otherwise is made ground level.

In the non-volatile memory circuit 10 illustrated in FIG. 1, configuration is made with n of the individual unit cells illustrated in FIG. 2, connected together in parallel between the power supply line 11 (node 0) and the output line 16 (node 1), and as described above includes the unit cells $12_1$ to $12_n$, the write power supply circuit 20, the read power supply circuit 30, and the detector 17.

The write power supply circuit 20 is a circuit for supplying the write voltage (HV) from an external power source when writing to the zener zap devices, and the read power supply circuit 30 is a circuit for supplying the read voltage (IVC) from the external power source when reading from the zener zap devices. The detector 17 is a circuit for detecting current flowing in each of the zener zap devices and converting the current into a voltage.

In FIG. 1, the signal line 13 transmitting the signal db is commonly connected to the signal db input terminal of the NOR circuit NOR 0 of each of the unit cells $12_1$ to $12_n$ such as illustrated in FIG. 2. The signal lines $15_1$ to $15_n$ transmitting the signals $selb_1$ to $selb_n$ are respectively connected to the signal $selb_k$ input terminals of the NOR circuit NOR 0 and the NOR circuit NOR 1 of each of the unit cells $12_1$ to $12_n$ such as illustrated in FIG. 2. The signal line 14 transmitting the signal rdb is commonly connected to the signal rdb input terminal of the NOR circuit NOR 1 of each of the unit cells $12_1$ to $12_n$ such as illustrated in FIG. 2.

The power supply line 11 is commonly connected as the node 0 to each of the unit cells $12_1$ to $12_n$ such as illustrated in FIG. 2, and the output line 16 commonly connects together each of the unit cells $12_1$ to $12_n$ and the detector 17.

Figure 3:
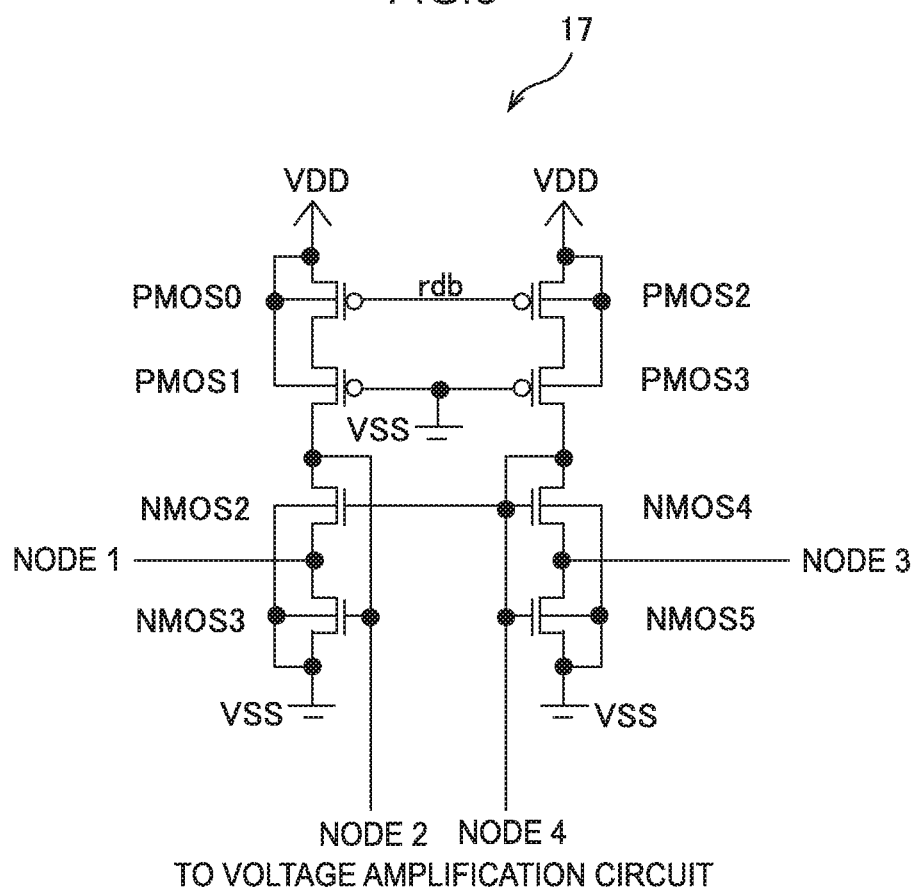
FIG. 3 is a circuit diagram illustrating a configuration example of a detector employed with the non-volatile memory circuit illustrated in FIG. 1.

Detailed explanation follows regarding the detector 17, with reference to FIG. 3.

FIG. 3 illustrates a circuit configuration of the detector 17 including transistors PMOS 0 to PMOS 3 configured from P-channel MOS transistors, and transistors NMOS 2 to NMOS 5 configured from N-channel MOS transistors.

The signal rdb of FIG. 1 and FIG. 2 is input as the signal rdb in FIG. 3, VDD is the power supply voltage, and the reference voltage VSS is ground level.

The transistor PMOS 0, the transistor PMOS 1, the transistor NMOS 2, and the transistor NMOS 3 are connected together in series. The source of the transistor PMOS 0 is connected to the VDD and the source of the transistor NMOS 3 is connected to the reference voltage VSS.

The transistor PMOS 2, the transistor PMOS 3, the transistor NMOS 4, and the transistor NMOS 5 are connected together in series. The source of the transistor PMOS 2 is connected to the VDD and the source of the transistor NMOS 5 is connected to the reference voltage VSS.

The gate of the transistor PMOS 0 and the gate of the transistor PMOS 2 are connected together and input with the signal rdb. The gates of the transistor PMOS 1 and the transistor PMOS 3 are each commonly connected to the reference voltage VSS.

The gate of the transistor NMOS 2, the gate of the transistor NMOS 4 and the gate of the transistor NMOS 5 are each commonly connected to the drain of the transistor NMOS 4 (node 4), and the gate of the transistor NMOS 3 is connected to the drain of the transistor NMOS 2 (node 2).

In FIG. 3, the node 3 is a node into which a current (referred to below as reference current) flows when reading to determine whether or not the zener zap device has been written to or is not-yet written to, and substantially half of the current that flows after zener zap device writing flows to the transistor NMOS 5.

The node 1 and the node 3 are at the detector input voltage level of about 0.3V during reading, and are each otherwise at ground level.

The node 2 and the node 4 are each at an intermediate voltage of about 1.5V during reading, and are each otherwise at ground level.

Explanation next follows regarding operation of the non-volatile memory circuit 10 configured as illustrated in FIG. 1 to FIG. 3.

First, in with regards to a writing operation, explanation follows regarding an example of operation to write data to the zener zap device ZAPk illustrated in FIG. 2. Explanation is of a data writing operation to the unit cell 12k of FIG. 1.

When writing data to the zener zap device ZAPk, the write voltage (HV) higher than the power supply voltage is applied to the cathode to cause zener breakdown, and the power supply line 11 (node 0) becomes voltage HV. Then the signal $selb_k$ is made ground level (L) so as to select the unit cell 12k, the signal db is made L, and the signal rdb is made H.

When in this signal state, the output of the NOR circuit NOR 0 in FIG. 2 is H, the output of the NOR circuit NOR 1 is L, the transistor NMOS 0 is ON, and the transistor NMOS 1 is OFF.

The anode of the zener zap device ZAPk is accordingly connected to the ground level reference voltage VSS, the zener zap device ZAPk undergoes zener breakdown and data is written thereto. Data writing can also be performed in a similar manner for the other zener zap devices.

Similarly, data is written to subsequent writing target zener zap devices by connecting the anode of the writing target zener zap device to the ground level reference voltage VSS.

Figure 4:
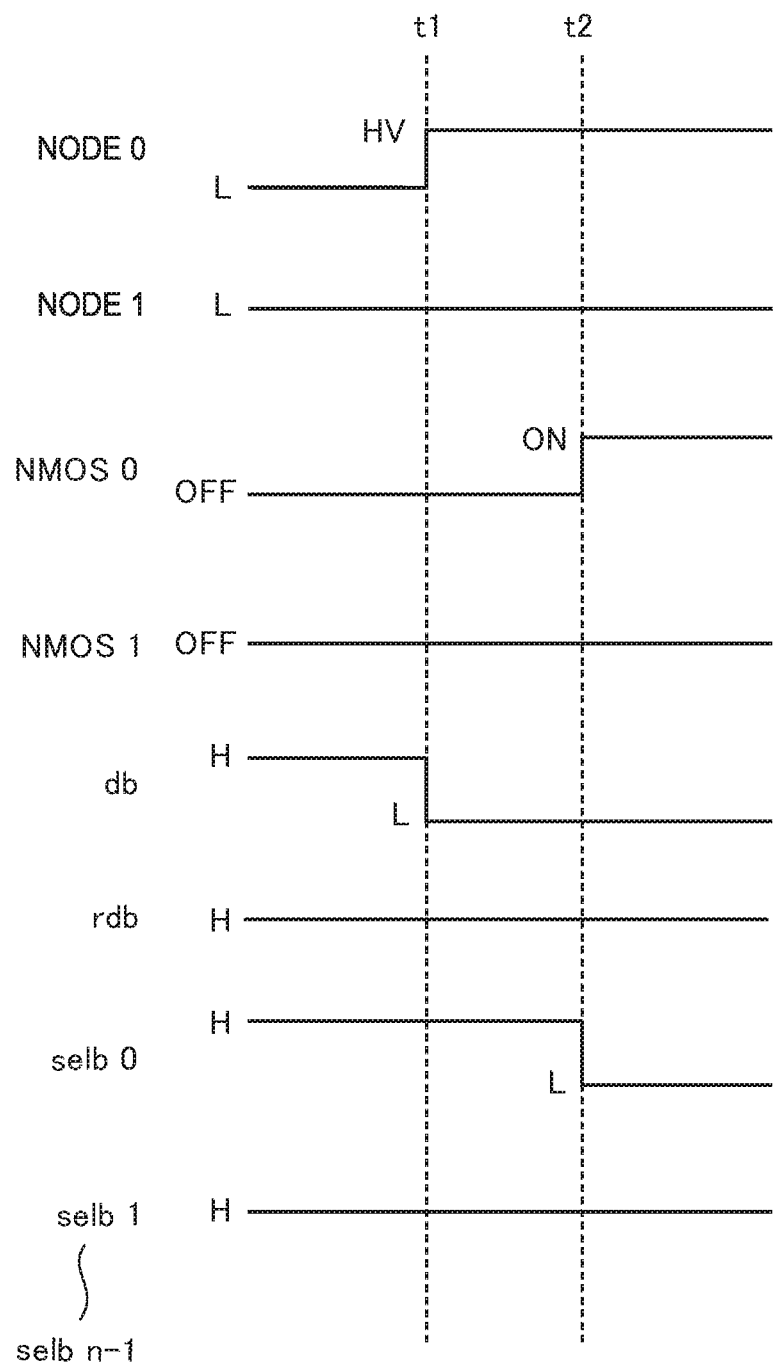
FIG. 4 is a timing chart illustrating an example of operation during write processing on the non-volatile memory circuit illustrated in FIG. 1.

Explanation follows regarding a write operation of the non-volatile memory circuit 10, with reference to FIG. 4.

First, an H signal is input as each of the signal db, the signal rdb and the signals $selb_1$ to $selb_n$, with the node 0 and the node 1 at ground level (L).

In the unit cells $12_1$ to $12_n$, in FIG. 2 the signal $selb_k$ is H, the signal db is H, and the signal rdb is H, the NOR circuit NOR 0 and the NOR circuit NOR 1 accordingly both output L, and the transistor NMOS 0 and the transistor NMOS 1 are both OFF. In this state the current of the zener zap devices does not flow to the detector 17 regardless of the data in each of the zener zap devices.

When signal db is input as L from this state (a), the voltage of HV is supplied from the write power supply circuit 20 to the node 0 (the power supply line 11).

Then the signal $selb_1$ of FIG. 1 is input as L through the signal line $15_1$ (t2). In this case, in the unit cell $12_1$ of FIG. 1 the signal $selb_k$ in FIG. 2 is L, the signal db is L, and the signal rdb is H, and so the NOR circuit NOR 0 outputs H, and the NOR circuit NOR 1 outputs L. The transistor NMOS 0 is accordingly switched ON and the transistor NMOS 1 switched OFF, the voltage HV from the node 0 (the power supply line 11) is applied to the zener zap device of the unit cell $12_1$, current flows in this zener zap device and the data in the unit cell $12_1$ is read.

Next, explanation follows concerning a read operation of the non-volatile memory circuit 10 configured as illustrated in FIG. 1 and FIG. 2 regarding an example of a case in which the zener zap device of the unit cell $12_k$ has been written to (referred to below as data 1), and the zener zap device of the unit cell $12_{k+1}$ has not yet been written to (referred to below as data 0).

Each signal of the signal db, signal rdb, and signals $selb_1$ to $selb_n$ in FIG. 1 are input at H, and the power supply line 11 (node 0) and the output line 16 (node 1) are at ground level.

In FIG. 2, since the signal $selb_k$ is H, the signal db is H, and the signal rdb is H for the unit cells $12_1$ to $12_n$, the NOR circuit NOR 0 and the NOR circuit NOR 1 accordingly both output L, the transistor NMOS 0 and the transistor NMOS 1 are both OFF, and current of the zener zap devices does not flow to the detector 17 regardless of the data in each of the zener zap devices.

From this state, L is input as the signal rdb, the voltage IVC is supplied from the read power supply circuit 30 to the node 0 (power supply line 11), and a voltage of around 0.3V is supplied from the detector 17 to the node 1 (output line 16).

When this occurs, the greater the number of individual unit cells connected in parallel, the greater the time until the node 0 (the power supply line 11) and the node 1 (the output line 16) reach a specific voltage. However, the non-volatile memory circuit 10 of the present exemplary embodiment uses the detector 17 to shorten the duration for reading the zener zap device after the node 0 (the power supply line 11) and the node 1 (the output line 16) have reached the specific voltage in the following manner.

Current flows in the transistor PMOS 0 and the transistor PMOS 2 configuring the detector 17 of FIG. 3 under input with the signal rdb at L, and the reference current flows from the node 3 through the transistor NMOS 5 to the VSS.

At this point in time, the node 3 is at 0.3V, and the node 4 is at the intermediate voltage of 1.5V. However there is no flow of current from the node 1 through the transistor NMOS 3 to the VSS. The node 1 accordingly reaches a lower voltage than 0.3V, and the node 2 is thereby made a lower voltage than the 1.5V.

The node 2 and the node 4 are connected to a differential voltage amplification circuit, not shown in the drawings, and a voltage of the amount by which the voltage of the node 2 is lower than the voltage of the node 4 is amplified by the differential voltage amplification circuit and output (in this case L is output).

Next, the signal $selb_k$ in FIG. 1 is input as L through the signal line $15_k$. When this occurs, in each of the unit cells other than the unit cell $12_k$, in FIG. 2 the signals $selb_1$ to $selb_n$ other than the signal $selb_k$ are H, the signal db is H, and the signal rdb is L. The NOR circuit NOR 0 and the NOR circuit NOR 1 both accordingly output L, making the transistor NMOS 0 and the transistor NMOS 1 both OFF, and current of the zener zap device does not flow to the detector 17 regardless of the data in the zener zap device.

However, in the unit cell $12k$ of FIG. 1, since in FIG. 2 the signal $selb_k$ is L, the signal db is H, and the signal rdb is L, the NOR circuit NOR 0 outputs L and the NOR circuit NOR 1 outputs H, making the transistor NMOS 0 OFF and the transistor NMOS 1 ON. Since the zener zap device of the unit cell $12k$ holds data 1, current flows to the node 1 (the output line 16).

When this occurs, the current that flows in the zener zap device is twice a reference current, and so the voltage of the node 1 in FIG. 3 becomes higher than the voltage of 0.3V at node 3.

In such cases, the node 2 in FIG. 3 also becomes a voltage higher than the 1.5V of the node 4, and as a result a voltage of the amount by which the voltage of the node 2 is higher than the voltage of the node 4 is amplified by the differential voltage amplification circuit and output (output as H in this case).

At this stage, due to a negative feedback circuit arising from the node 2 being connected to the gate of the transistor NMOS 3, the ON resistance of the transistor NMOS 3 becomes small as the voltage of the node 2 rises. Voltage rises in the node 1 and the node 2 are suppressed as a result.

Thus in the detector 17, voltage rises of the node 1 and the node 2 in the data read operation can be suppressed to a voltage within a predetermined voltage swing due to the negative feedback circuit configured for the node 2, and operation as an amplitude controller of the present invention.

Thus in the non-volatile memory circuit 10 of the present exemplary embodiment, the time taken for each read operation can be shortened, facilitating increasing the number of unit cells to achieve increased capacity.

Next, H is input as the signal $selb_k$ from the signal line $15_k$ to the unit cell $12_k$ in FIG. 1, and L is input as the signal $selb_{k+1}$ from the signal line $15_{k+1}$ to the unit cell $12_{k+1}$. When this occurs, in each of the unit cells other than the unit cell $12_{k+1}$, since in FIG. 2 the signal $selb_k$ is H, the signal db is H, and the signal rdb is L, the NOR circuit NOR 0 and the NOR circuit NOR 1 both output L, making the transistor NMOS 0 and the transistor NMOS 1 both OFF, and current of the zener zap devices does not flow to the detector 17 regardless of the data in each of the zener zap devices.

However, in the unit cell $12_{k+1}$, since in FIG. 2 the signal $selb_{k+1}$ is L, the signal db is H, and the signal rdb is L, the NOR circuit NOR 0 outputs L and the NOR circuit NOR 1 outputs H, making the transistor NMOS 0 OFF and the transistor NMOS 1 ON.

Current does not however flow in the zener zap device of the unit cell $12_{k+1}$ since it holds data 0. Accordingly, the voltage of the node 1 in FIG. 3 becomes a voltage lower than the 0.3V at the node 3.

In this case, the node 2 of FIG. 3 also becomes a voltage lower than the 1.5V at the node 4, and a voltage of the amount by which the voltage of the node 2 is lower than the voltage of the node 4 is amplified by the differential voltage amplification circuit and L is output as a result.

When this occurs, due to the negative feedback circuit arising from the node 2 being connected to the gate of the transistor NMOS 3, the voltage of the node 2 falls, and the ON resistance of the transistor NMOS 3 increases, leading to the voltage fall of the node 1 and the node 2 being suppressed.

Thus in the detector 17, voltage falls of the node 1 and the node 2 in the data read operation can be suppressed to a voltage within a predetermined voltage swing due to the negative feedback circuit configured for the node 2, and operation as the amplitude controller of the present invention.

Thus in the non-volatile memory circuit 10 of the present exemplary embodiment, the time taken for each read operation can be shortened, facilitating increasing the number of unit cells to achieve increased capacity.

Similarly, data written to subsequent read target zener zap devices can be read by making the selection signal of each of the read target zener zap devices L, and making the selection signal of all the zener zap devices other than the read target zener zap device H.

Due to the above, although two ZapFuse selection transistors and two NOR gates are required, according to the non-volatile memory circuit 10 of the present exemplary embodiment a reduction can be achieved of one latching circuit, two diodes, and one resistor compared to the related PROM circuit disclosed in JP-A No. 2007-265540, with this being advantageous to increasing capacities.

The duration required for the power supply line 11 (the node 0) and the output line 16 (the node 1) to reach a specific voltage when the signal rdb is switched over from H to L is longer the greater the number of unit cells. However, due to the negative feedback circuit (the amplitude controller) of the detector 17 suppressing the voltage swing of the output line 16 (the node 1) during reading when the signals $selb_1$ to $selb_n$ have been switched, the reading speed can be prevented from falling due to increasing the number of the unit cells.

Figure 5:
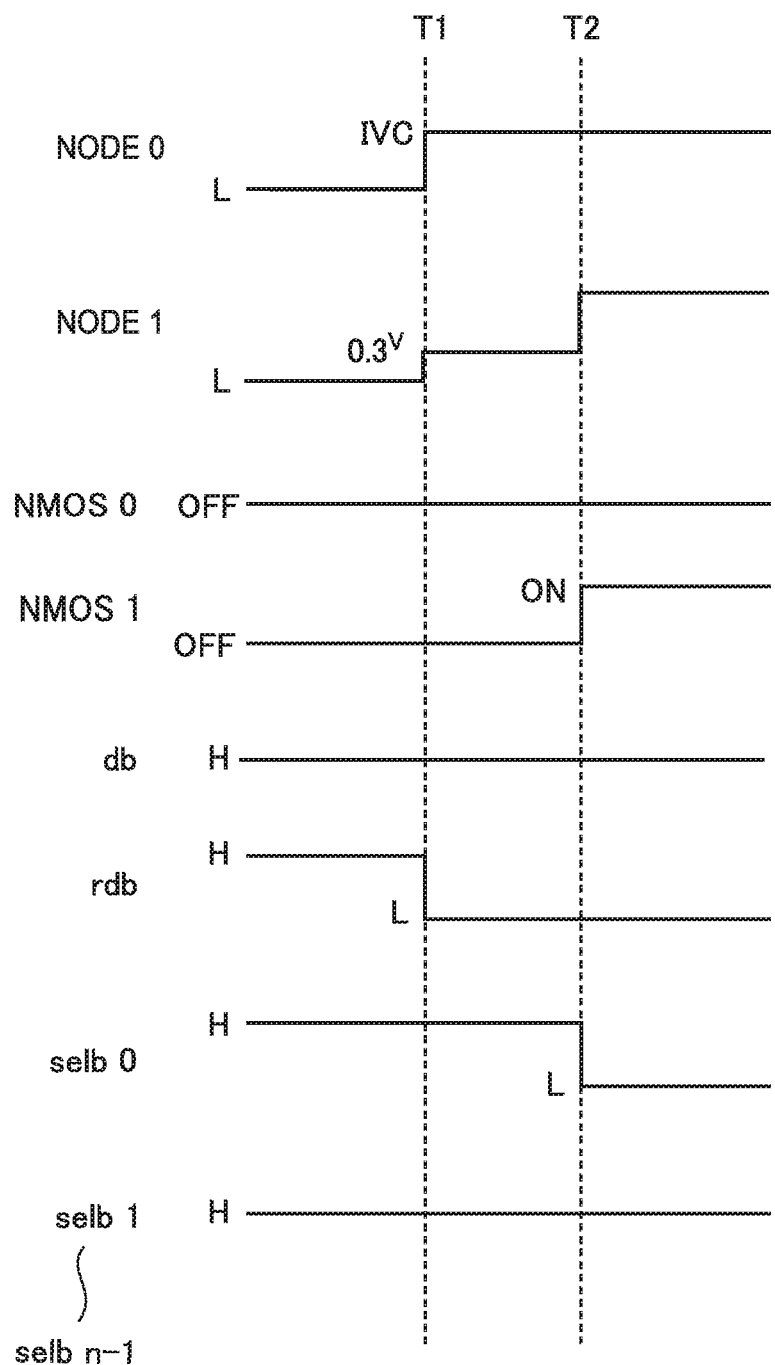
FIG. 5 is a timing chart illustrating an example of operation during read processing on the non-volatile memory circuit illustrated in FIG. 1.

Explanation follows regarding a read operation of the non-volatile memory circuit 10 configured as illustrated in FIG. 1 and FIG. 2, with reference to FIG. 5.

First an H signal is input respectively as the signal db, the signal rdb and the signals $selb_1$ to $selb_n$, and the node 0 and the node 1 are placed at ground level (L).

Since in FIG. 2 the signal $selb_k$ is H, the signal db is H, and the signal rdb is H for the unit cells $12_1$ to $12_n$, the NOR circuit NOR 0 and the NOR circuit NOR 1 accordingly both output L and the transistor NMOS 0 and the transistor NMOS 1 are both OFF. In this state current of the zener zap devices does not flow to the detector 17 regardless of the data in each of the zener zap devices.

When from this state L is input as the signal rdb (T1), the voltage IVC is supplied from the read power supply circuit 30 to the node 0 (power supply line 11), and a voltage of around 0.3V is supplied from the detector 17 to the node 1 (output line 16).

Next, the signal $selb_1$ in FIG. 1 is input as L through the signal line $15_1$ (T2). In this case, in the unit cell $12_1$ of FIG. 1, the signal $selb_k$ in FIG. 2 is L, the signal db is H, and the signal rdb is L. The NOR circuit NOR 0 accordingly outputs L and the NOR circuit NOR 1 outputs H, making the transistor NMOS 0 OFF and the transistor NMOS 1 ON. Current accordingly flows to the node 1 (the output line 16) due to data 1 being held by the zener zap device of the unit cell $12_1$. When this occurs the current flowing in the zener zap device is a multiple of the reference current, and so the voltage of the node 1 becomes a voltage higher than 0.3V.

Note that in each of the unit cells other than the unit cell $12_1$, since the signals $selb_2$ to $selb_n$ are H, the signal db is H, and the signal rdb is L, the NOR circuit NOR 0 and the NOR circuit NOR 1 accordingly both output L, the transistor NMOS 0 and the transistor NMOS 1 are both OFF, and current of the zener zap devices does not flow to the detector 17 regardless of the data in each of the zener zap devices.

Consequently, in the state in which the node 0 (the power supply line 11) at voltage H is commonly connected to the respective cathodes of each of the zener zap devices of the plural unit cells (storage element sections) $12_1$ to $12_n$, operation to read data can be performed by sequentially switching and inputting L for the signals $selb_1$ to $selb_n$, switching each of the transistors NMOS 1 from OFF to ON in sequence when the respective transistors NMOS 0 of each of the unit cells have been switched OFF, and inputting current values flowing in the zener zap devices of each of the unit cells $12_1$ to $12_n$ in sequence to the detector 17.

Figure 6:
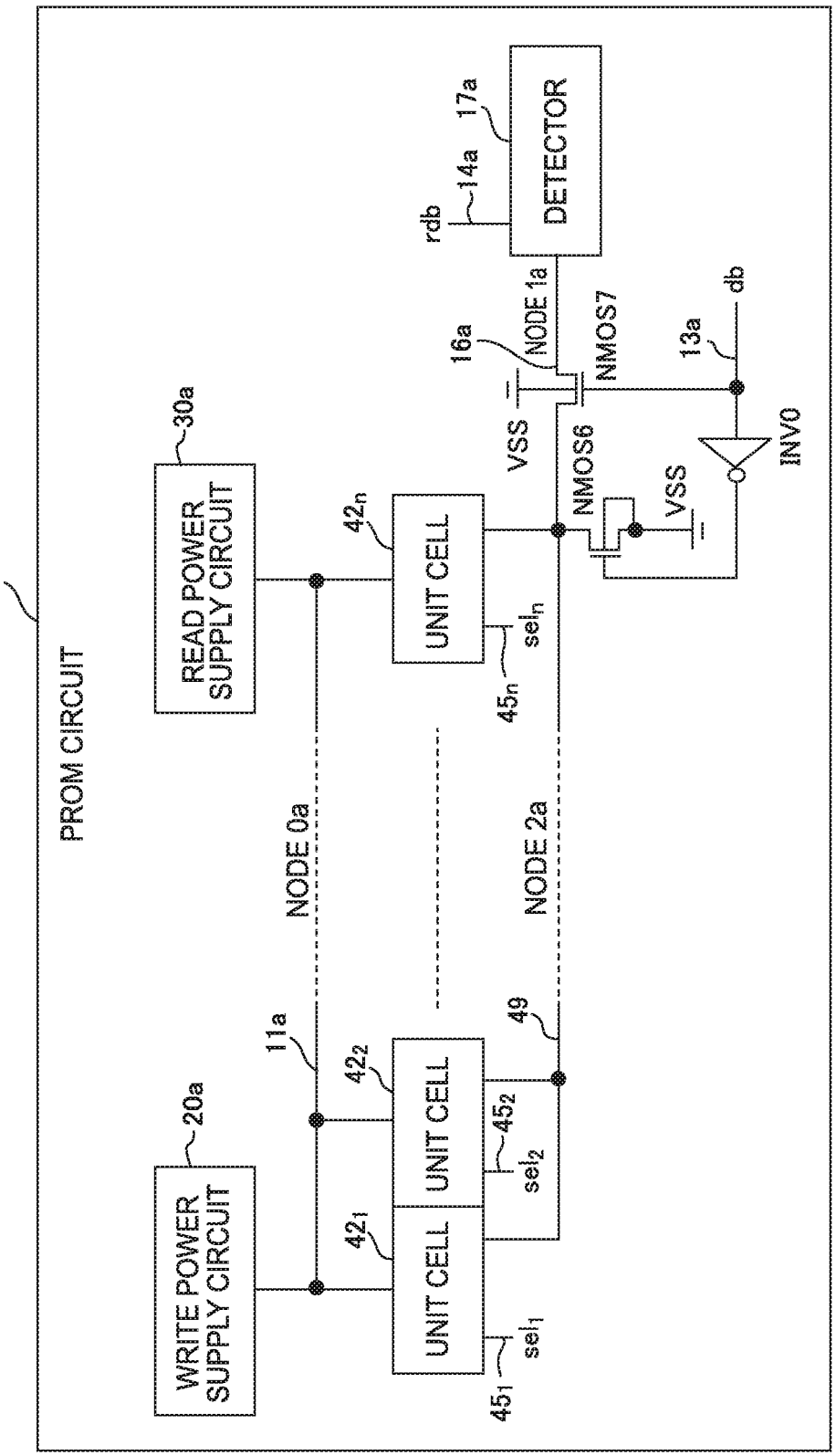
FIG. 6 is a block diagram illustrating a configuration example of a non-volatile memory circuit according to another exemplary embodiment.
Figure 7:
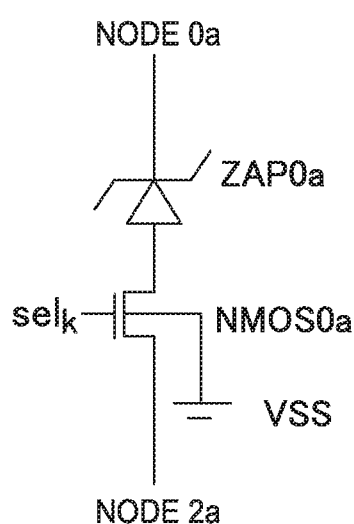
FIG. 7 is a circuit diagram illustrating a configuration example of a storage element circuit employed in the non-volatile memory circuit illustrated in FIG. 6.

Explanation next follows regarding another exemplary embodiment of the present invention, with reference to FIG. 6 and FIG. 7.

FIG. 6 illustrates a configuration of a non-volatile memory circuit (annotated as "PROM circuit" in FIG. 6) 10a according to another exemplary embodiment. The non-volatile memory circuit 10a includes: a write power supply circuit 20a; a read power supply circuit 30a; a power supply line 11a (also referred to below as node 0a) that selectively supplies a data write voltage from the write power supply circuit 20a or a data read voltage from the read power supply circuit 30a; n (n being an integer of two or more) individual unit cells $42_1$ to $42_n$ that serve as storage element sections, as shown in detail in FIG. 7, each storing one bit of data and respectively connected in parallel between the power supply line 11a and a reference power supply line connected to ground level, not shown in the drawings; signal lines 13a, 14a, and $45_1$ to $45_n$ that input a signal db, a signal rdb, and signals $sel_1$ to $sel_n$ from an externally provided control section to each of the unit cells $42_1$ to $42_n$; and a detector 17a that is input through a second output line (also referred to below as node 2a) 49 and an output line 16a (also referred to below as node 1a) with an output current from the unit cells $42_1$ to $42_n$ during data reading.

The non-volatile memory circuit 10a also includes two transistor NMOS 6, 7 configured by N-channel MOS transistors between each of the unit cells $42_1$ to $42_n$ and the detector 17a. The respective gates of the transistor NMOS 6 and the transistor NMOS 7 are connected together through an inverter INV 0.

The signal db is input directly to the gate of the transistor NMOS 6, and the signal db is input to the gate of the transistor NMOS 7 through the inverter INV 0.

The drains of the transistor NMOS 6 and the transistor NMOS 7 are both connected to each of the unit cells $42_1$ to $42_n$ through the second output line 49 (the node 2a), the source of the transistor NMOS 6 is connected to a reference power source VSS, and the source of the transistor NMOS 7 is connected to the detector 17a through the output line 16a (the node 1a).

Each of the unit cells $42_1$ to $42_n$ illustrated in FIG. 6 are configured similarly to each other, and so explanation follows regarding a $k^{th}$ unit cell (where k=1, 2, -, n) illustrated in FIG. 7.

The unit cell in FIG. 7 includes: a zener zap device ZAPka with its cathode connected to the node 0a (power supply line 11a); and a transistor NMOS 0a that is connected to the anode of the zener zap device ZAPka and that connects the zener zap device ZAPka to the second output line 49 (the node 2a) during data writing.

Thus the unit cell serving as a storage element section provided to the non-volatile memory circuit 10a of the present exemplary embodiment illustrated in FIG. 7 is configured without the NOR circuit NOR 0 and the NOR circuit NOR 1 compared to the unit cell serving as the storage element section provided to the non-volatile memory circuit 10 illustrated in FIG. 2. The unit cell serving as the storage element section of the present exemplary embodiment is configured including a single zener zap device (ZapFuse) and a single ZapFuse selection transistor.

The transistor NMOS 0a is an N-channel MOS transistor, the reference voltage VSS is ground level, and the cathode of the zener zap device ZAPka is connected to the power supply line (node 0a), and the anode of the zener zap device ZAPkz is connected to the drain of the NMOS transistor NMOS 0a.

A signal $sel_k$ is input to the gate of the transistor NMOS 0a, and the source of the transistor NMOS 0a is connected to the second output line (the node 2a) 49.

Prior to writing, the zener zap device ZAPka acts as a diode and current accordingly does not flow from the cathode to the anode. However after writing the zener zap device ZAPka is shorted and so current flows from the cathode to the anode.

A voltage (IVC) that is lower than the power supply voltage is applied to the cathode of the zener zap device ZAPka when reading data from the zener zap device ZAPka, and data is read by detecting the current flowing in the zener zap device ZAPka.

A write (HV) that is higher than the power supply voltage level is applied to the cathode of the zener zap device ZAPka when writing data to the zener zap device ZAPka, writing data by causing zener breakdown to occur.

The signal $sel_k$ is made ground level (also referred to below as L) during non-selecting the $k^{th}$ zener zap device ZAPka, and is made the power supply voltage level (also referred to below as H) when selecting.

The node 0a (the power supply line 11a) is made IVC during reading, HV during writing, and otherwise is made ground level.

The node 2a (the second output line 49) is made the detector input voltage level of about 0.3V during reading, and otherwise is made ground level.

In the non-volatile memory circuit 10a illustrated in FIG. 6, configuration is made with n of the individual unit cells illustrated in FIG. 7 connected together in parallel, and as described above includes the unit cells $42_1$ to $42_n$, the write power supply circuit 20a, the read power supply circuit 30a, and the detector 17a. The signals $sel_1$ to $sel_n$ are signals with a similar function to the signal $sel_k$ of FIG. 7

The write power supply circuit 20a is a circuit for supplying the HV when writing to the zener zap devices (ZapFuses), and the read power supply circuit 30a is a circuit for supplying the IVC when reading from the zener zap devices. The detector 17a is a circuit for detecting current flowing in each of the zener zap devices and converting the current into a voltage.

In FIG. 6, the signal db is L when writing to the zener zap devices of each of the unit cells $42_1$ to $42_n$, and is otherwise H. The signals $sel_1$ to $sel_n$ are signals with a similar function to the signal $sel_k$ in the unit cells $42_1$ to $42_n$ shown in FIG. 7, and are employed to select each of the unit cells $42_1$ to $42_n$. The signal rdb is L when reading data from each of the unit cells $42_1$ to $42_n$ and is otherwise H.

The power supply line 11a is commonly connected to the node 0a of each of the unit cells $42_1$ to $42_n$ illustrated in FIG. 7, and the second output line 49 is commonly connected to the node 2a of each of the unit cells $42_1$ to $42_n$ illustrated in FIG. 7.

Note that the detector 17a is a circuit with a similar function to the detector 17 explained in detail with reference to FIG. 3 and so further detailed explanation thereof is omitted.

Signals $sel_1$ to $sel_n$ are respectively input as the signal $sel_k$ illustrated in FIG. 7 for the unit cells $42_1$ to $42_n$, and the signal rdb is input to the detector 17a. The power supply line 11a (the node 0a) is commonly connected to the node 0a of each of the unit cells $42_1$ to $42_n$.

The signal db of FIG. 6 is L during data writing, and is otherwise H. The signals $sel_1$ to $sel_n$ have a similar function to the signal $sel_k$ of FIG. 7, and are employed to select each of the unit cells $42_1$ to $42_n$. The signal rdb is L during data reading and is otherwise H.

Explanation follows regarding operation of the non-volatile memory circuit 10a configured as illustrated in FIG. 6 and FIG. 7.

Relating to a read operation, explanation follows of an example giving an example of a case in which the zener zap device of the unit cell $42_1$ has been written to (referred to below as data 1), and the zener zap device of the unit cell $42_2$ has not yet been written to (referred to below as data 0).

The signal db and the signal rdb in FIG. 6 are each input as H signals, and the signals $sel_1$ to $sel_n$ are each input as L signals.

In this case, the gate of the transistor NMOS 7 is input with the H signal as the signal db and is therefore ON, and the gate of the transistor NMOS 6 is input with the inverse signal to the signal db through the inverter INV0 and is therefore OFF. The node 0a and the node 1a and the node 2a are at ground level.

Since the unit cells $42_1$ to $42_n$ are input with L for the signal input as the signal $sel_k$ of FIG. 7, the transistor NMOS 0a is OFF, and current of the zener zap devices does not flow to the detector 17a regardless of the data in each of the zener zap devices.

When from this state an L signal is input as the signal rdb, the voltage IVC is supplied from the read power supply circuit 30a to the power supply line 11a (node 0a), and a voltage of around 0.3V is supplied from the detector 17a to the node 1a.

Since the transistor NMOS 7 is ON in this state, both the node 2a and the node 1a are supplied with the same voltage.

When this occurs, the greater the number of individual unit cells connected in parallel, the greater the time until the node 0, the node 1 and the node 2 reach a specific voltage.

H is then input as the signal $sel_1$ for the unit cell $42_1$ of FIG. 6. In this case, in each of the unit cells other than the unit cell $42_1$ an L signal is input as the signal $sel_k$ of FIG. 7 and so the transistors NMOS 0a thereof are OFF, and current of the zener zap devices does not flow to the detector 17a regardless of the data in each of the zener zap devices.

However, in the unit cell $42_1$, since an H signal is input as the signal $sel_k$ of FIG. 7, the transistor NMOS 0a is thereof switched ON. Current then flows since the zener zap device of the unit cell $42_1$ holds data 1.

When this occurs, the current that flows in the zener zap device is twice a reference current, and so the voltage of the node 1a becomes a higher voltage than 0.3V and data 1 is output from the detector 17a.

Note that the voltage rise at the node 1a is suppressed due to the input side of the detector 17a being configured as a negative feedback circuit, as explained in relation to FIG. 3.

Thus, the rise in voltage of node 1a during the data read operation can be suppressed to a voltage within a predetermined voltage swing by the negative feedback circuit configured in the detector 17a operating as the amplitude controller of the present invention.

Thus in the non-volatile memory circuit 10a of the present exemplary embodiment, the period of time taken for each of the read operations can be shortened, facilitating an increase in the number of unit cells to achieve increased capacity.

Next, L is input as the signal $sel_1$ to the unit cell $42_1$ in FIG. 6, and H is input as the signal $sel_1$ of the unit cell $42_2$. In this case, since an L signal is input as the signal $sel_k$ of FIG. 7 to each of the unit cells other than the unit cell $42_2$, the transistors NMOS 0a thereof are OFF, and current of the zener zap devices does not flow to the detector 17a regardless of the data in each of the zener zap devices.

However, in the unit cell $42_2$, since an H signal is input as the signal $sel_k$ of FIG. 7 the transistor NMOS 0a thereof is ON. Current does not however flow in the zener zap device of the unit cell $42_2$ since it holds data 0.

Accordingly, the voltage of the node 1a of FIG. 6, namely the voltage of node 1 of FIG. 3, becomes a voltage lower than 0.3V, and data 0 (L) is output from the detector 17a. The voltage fall of the node 1a is suppressed due to the input side of the detector 17a being configured as a negative feedback circuit as described above.

The fall in voltage of node 1a during the data read operation can accordingly be suppressed to a voltage within a predetermined voltage swing by the negative feedback circuit for the node 1 configured in the detector 17a operating as the amplitude controller of the present invention.

Thus in the non-volatile memory circuit 10a of the present exemplary embodiment, the period of time taken for each of the read operations can be shortened, facilitating an increase in the number of unit cells to achieve increased capacity.

As described above, according to the non-volatile memory circuit 10a illustrated in FIG. 6 and FIG. 7, with regard to the reading when switching over the signals $sel_1$ to $sel_n$, reading can be performed at a similar speed to that of the non-volatile memory circuit 10 explained in relation to FIG. 1 to FIG. 3.

Moreover, although the two transistors NMOS 6, 7 and the single inverter are additionally required compared to the non-volatile memory circuit 10 illustrated in FIG. 1, due to being able to eliminate two NOR gates and one NMOS within each of the unit cells, the non-volatile memory circuit 10a is even more advantageous to increasing capacity than the non-volatile memory circuit 10 illustrated in FIG. 1.

Figure 8:
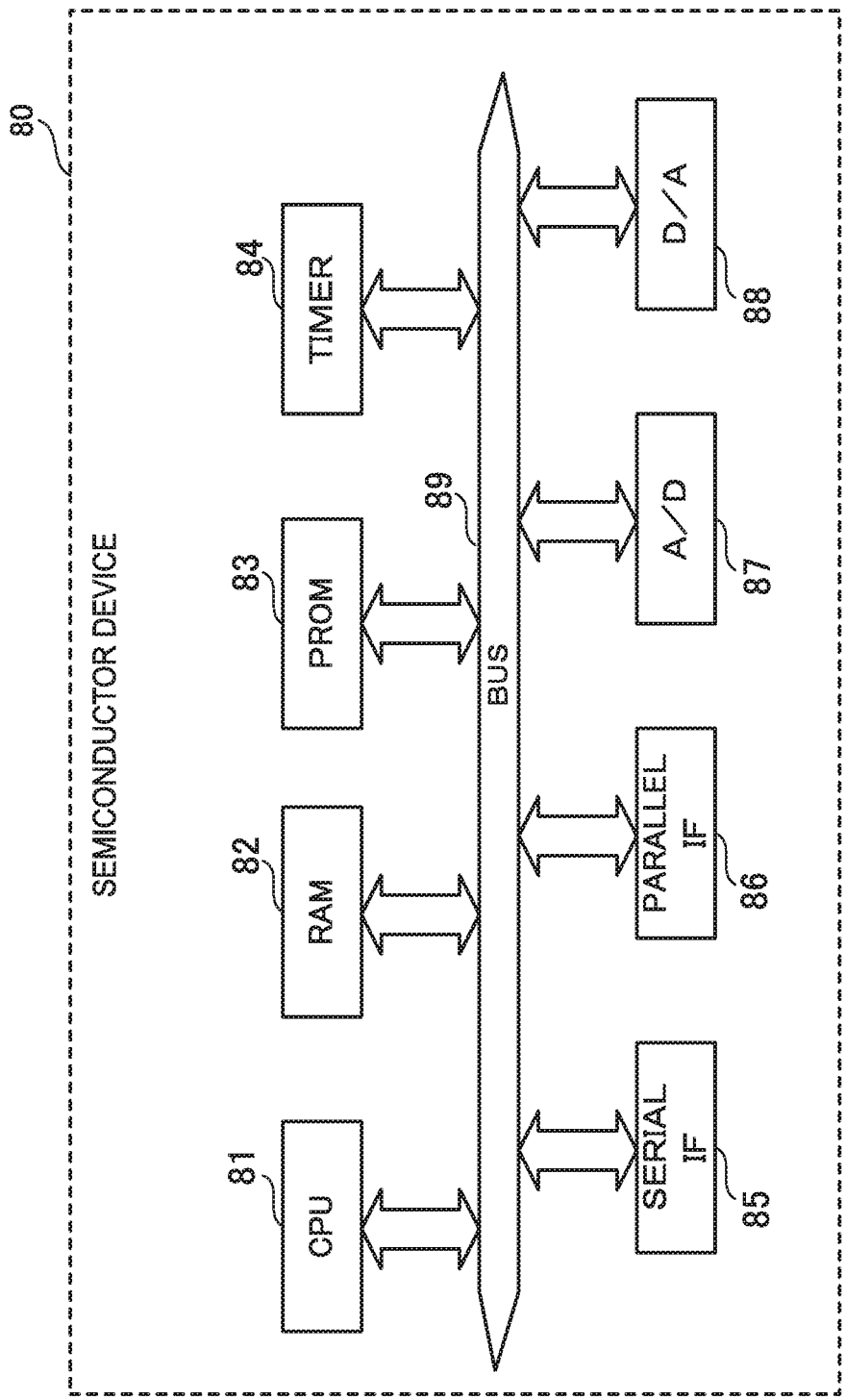
FIG. 8 a block diagram illustrating a configuration example of a semiconductor device provided with a non-volatile memory circuit according to an exemplary embodiment.

Explanation next follows regarding a semiconductor device employing a thus configured non-volatile memory circuit 10, 10a, with reference to FIG. 8.

FIG. 8 illustrates a semiconductor device 80 of the present example that includes a CPU 81, RAM 82, a PROM 83 according to the present invention, a timer (denoted "TIMER" in FIG. 8) 84, a serial interface (denoted "SERIAL IF" in FIG. 8) 85, a parallel interface (denoted "PARALLEL IF" in FIG. 8) 86, an AD converter (denoted "A/D" in FIG. 8) 87, and a DA converter (denoted "D/A" in FIG. 8) 88, with these connected together through a BUS 89.

For example, the RAM 82 is configured with 1024 bytes, and the PROM 83 is configured with 60 kilobytes of capacity. The CPU 81 (a central processing unit) performs writing data, such as a program, and reading of data to and from the PROM 83 based on control signals from an external device connected through the serial interface 85 or the parallel interface 86.

The thus configured semiconductor device 80 is for example provided to various types of control boards employed in vehicle control, to various types of control board of manufacturing equipment, or to various types of electrical component in for example a mobile telephone.

As explained above with reference to the drawings, the non-volatile memory circuit 10, 10a of the present example is configured including plural (n individual) storage element sections (unit cells) that each contain a zener zap device (ZapFuse), and a switch section (the transistor NMOS 1, 1a)

that during data reading connects the anode of the zener zap device to the output terminal. The cathodes of each of the zener zap devices in the plural storage element sections are commonly connected so as to be connected to the write power supply (the write power supply circuit 20, 20a) or the read power supply (the read power supply circuit 30, 30a). The output terminals of the plural storage element sections are commonly connected to the input terminals of the detector 17, 17a. The anodes of the storage element sections are connected to a ground voltage during data writing, and the switch sections are switched ON during data reading and the anodes of the storage element section are connected through the output terminal to the input terminal of the detector.

Note that during data reading, the detector converts the current values output in sequence from the plural storage element sections into voltages lying within a predetermined amplitude and outputs the converted voltages.

Moreover, in the non-volatile memory circuit 10, the drain of the transistor NMOS 1 serving as the switch section is connected to the anode of the zener zap device, the source of the transistor NMOS 1 is connected to the output terminal, and a read instruction signal is input to the gate of the transistor NMOS 1 during data reading. Each of the unit cells serving as storage element sections is provided with the transistor NMOS 0 whose drain is connected to the anode of the zener zap device, whose source is connected to ground and whose gate is input with a write instruction signal during data writing. Note that the transistor NMOS 0 is switched ON when the write instruction signal is input to its gate, so as to connect the anode of the zener zap device whose cathode is connected to the write power supply to ground.

In the non-volatile memory circuit 10a, the transistor NMOS 1 serving as a switch section has its drain connected to the anode of the zener zap device, has its source connected to the output terminal, and its gate is input with a read instruction signal during data reading and with a write instruction signal during data writing. Moreover, the transistors NMOS 6, 7 configuring a switch over section are also provided between the output terminal and the detector 17a. The transistors NMOS 6, 7 switch over to connect the output terminal to ground during data writing and to connect the output terminal to the input terminal of the detector 17a during data reading.

The transistor NMOS 6 has its drain connected to the output terminal, has its source connected to ground, and its gate is input with a write instruction signal. The transistor NMOS 7 has its drain connected to the drain of the transistor NMOS 6, has its source connected to the input terminal of the detector 17a, and its gate is input with a read instruction signal during data reading. Note that when the transistor NMOS 6 is switched ON when its gate is input with the write instruction signal during data writing, connecting the anode of the zener zap device of the unit cell whose cathode is connected to the write power supply to ground. The transistor NMOS 7 is switched ON when its gate is input with the read instruction signal during data reading, connecting the anode of the unit cell whose zener zap device cathode is connected to the read power supply, through the output terminal to the input terminal of the detector 17a.

Thus in the non-volatile memory circuit 10, 10a of the present exemplary embodiments, the read power supply is commonly connected to the cathodes of each of the zener zap devices of each of the unit cells (the storage element sections) during data reading control, and each of the switch sections of the plural storage element sections are sequentially controlled such that current values flowing in the zener zap devices of the plural storage element sections are input in sequence to the detector 17, 17a. The detector 17, 17a accordingly converts the current values output sequentially from the plural storage element sections during data reading to voltages lying within a predetermined amplitude, and outputs the converted voltages.

Thus the non-volatile memory circuits 10, 10a of the present exemplary embodiments are able to shorten the period of time taken for each of the read operations, facilitating increasing the number of unit cells to achieve increased capacity.

Note that the present invention is not limited to the examples explained using each of the drawings, and various modifications are possible within a range not departing from the spirit of the present invention. For example in the present example, in the non-volatile memory circuit 10 explained using FIG. 1 to FIG. 3, explanation has been given of an example wherein the node 0 and the node 1 are at ground level apart from during read operations or write operations. However, it is also possible to eliminate a time delay when the signal input as the signal rdb is switched from H to L by making the node 0 IVC, and making the node 1a detector input voltage level of around 0.3V at all times other than during write operations.

Moreover, in the non-volatile memory circuit 10 explained with reference to FIG. 1 to FIG. 3, and in the non-volatile memory circuit 10a explained with reference to FIG. 4 and FIG. 5, although explanation has been given of a case in which during reading the voltage levels of the node 1 and the node 3 of the detector 17 illustrated in FIG. 3 is about 0.3V, and the voltage levels of the node 2 and the node 4 of the detector 17 are about 1.5V, configuration may be made with voltage levels other than these.

Moreover, in the non-volatile memory circuit 10, 10a, explanation has been given of a case in which the detector 17, 17a are configured by NMOS transistor and PMOS transistor, however the detector 17, 17a may also be configured by elements such as resistors.

Although explanation has been given of examples in which in the non-volatile memory circuit 10, 10a is supplied with HV from the write power supply circuit 20, 20a and is supplied with IVC from the read power supply circuit 30, 30a, configuration may be made with direct supply from pads.

In the non-volatile memory circuit 10a, explanation has been given of an example in which the node 0a, the node 1a, and the node 2a are at ground level at times other than during read operations and writing operations, it is possible to eliminate a time delay when the signal input as the signal rdb is switched over from H to L by making the node 0a at IVC and making the node 1a and the node 2a at a detector input voltage level of around 0.3V at all times other than during write operations.

The present exemplary embodiments are configured such that the voltage output from the detector 17, 17a is amplified with the differential voltage amplification circuit, however configuration may be made with a differential voltage amplification circuit provided internally to the detector 17, 17a.

What is claimed is:
1. A non-volatile memory circuit comprising:
a zener zap device having a cathode that is connected to a first node;
a first transistor having a terminal that is connected to an anode of the zener zap device, and having another terminal that is connected to a ground voltage;

a second transistor having a terminal that is connected to the anode of the zener zap device, and having another terminal that is connected to a second node;
a first logic circuit having an output terminal that is connected to a control terminal of the first transistor;
a second logic circuit having an output terminal that is connected to a control terminal of the second transistor; and
a detector that is connected to the second node,
wherein a first signal is input to both of the first logic circuit and the second logic circuit,
wherein the first signal is a selection signal,
a write instruction signal is input to the first logic circuit, and
a read instruction signal is input to the second logic circuit,
in a case in which the read instruction signal is input to the detector, the detector supplies a predetermined voltage to the anode of the zener zap device.

2. The non-volatile memory circuit of claim 1, wherein each of the first logic circuit and the second logic circuit is a NOR circuit.

3. The non-volatile memory circuit of claim 1, wherein: the first transistor is switched ON during data writing, and the second transistor is switched ON during data reading.

4. The non-volatile memory circuit of claim 1, wherein: the read instruction signal is connected to the detector, and a reference current flows in the detector based on the read instruction signal.

5. The non-volatile memory circuit of claim 1, wherein the detector comprises a negative feedback circuit that restricts a voltage to an input terminal of the detector so as to lie within a predetermined amplitude.

6. The non-volatile memory circuit of claim 1, wherein:
a drain of the first transistor is connected to the anode of the zener zap device,
a source of the first transistor is connected to the ground voltage,
a drain of the second transistor is connected to the anode of the zener zap device, and
a source of the second transistor is connected to the detector.

7. The non-volatile memory circuit of claim 1, further comprising:

a third transistor having a drain that is connected to the anode of the zener zap device, having a source that is connected to the detector, and having a gate that is input with a read instruction signal during data reading and input with a write instruction signal during data writing; and
a switch over section that is provided between the detector and a common output terminal of the second transistor and the third transistor, the switch over section switching such that the common output terminal is connected to ground during data writing and connected to an input terminal of the detector during data reading.

8. The non-volatile memory circuit of claim 7, wherein the switch over section comprises:
a fourth transistor having a drain that is connected to the common output terminal, having a source that is connected to ground, and having a gate that is input with a write instruction signal; and
a fifth transistor having a drain that is connected to the drain of the fourth transistor, having a source that is connected to the input terminal of the detector, and having a gate that is input with the read instruction signal.

9. The non-volatile memory circuit of claim 1, wherein a source of the second transistor is connected to an input terminal of the detector.

10. The non-volatile memory circuit of claim 1, wherein:
a plurality of zener zap devices are connected in parallel, and
the first signal selects a zener zap device from the plurality of zener zap devices as a target for reading out or a target for writing.

11. The non-volatile memory circuit of claim 10, wherein:
the anode of the zener zap device is connected to the ground voltage only during data writing, and
the second transistor is switched ON only during data reading so as to connect the anode of the zener zap device to an input terminal of the detector.

12. The non-volatile memory circuit of claim 10, wherein the detector further comprises a conversion section that converts a current value, that is output in a case in which the zener zap device that is the target for reading out, among the plurality of zener zap devices, changes during data reading, to a voltage that lies within a predetermined amplitude.

* * * * *